United States Patent

Chester et al.

[11] Patent Number: 5,930,301
[45] Date of Patent: Jul. 27, 1999

[54] UP-CONVERSION MECHANISM EMPLOYING SIDE LOBE-SELECTIVE PRE-DISTORTION FILTER AND FREQUENCY REPLICA-SELECTING BANDPASS FILTER RESPECTIVELY INSTALLED UPSTREAM AND DOWNSTREAM OF DIGITAL-TO-ANALOG CONVERTER

[75] Inventors: David B. Chester; Richard D. Roberts, both of Palm Bay, Fla.

[73] Assignee: Harris Corporation, Melbourne, Fla.

[21] Appl. No.: 08/671,025

[22] Filed: Jun. 25, 1996

[51] Int. Cl.[6] .............................. H04K 1/02; H04L 25/03
[52] U.S. Cl. ........................... 375/296; 375/297; 375/298
[58] Field of Search ..................................... 375/296, 297, 375/298; 455/43, 63; 332/102, 103, 144, 145, 146

[56] References Cited

U.S. PATENT DOCUMENTS

| | | | |
|---|---|---|---|
| 4,244,047 | 1/1981 | Perkins | 370/69 |
| 4,974,236 | 11/1990 | Gurcan et al. | 375/61 |
| 5,042,085 | 8/1991 | Errico | 455/43 |
| 5,077,757 | 12/1991 | Cahill | 375/59 |
| 5,107,520 | 4/1992 | Karam et al. | 375/60 |
| 5,202,900 | 4/1993 | Leitch | 375/51 |
| 5,220,557 | 6/1993 | Kelley | 375/50 |
| 5,249,200 | 9/1993 | Chen et al. | 375/58 |
| 5,351,016 | 9/1994 | Dent | 375/296 |
| 5,396,190 | 3/1995 | Murata | 455/63 |

*Primary Examiner*—Chi H. Pham
*Assistant Examiner*—Emmanuel Bayard
*Attorney, Agent, or Firm*—Charles E. Wands

[57] ABSTRACT

An up-converter for digitally sampled baseband signals takes advantage of the sinc(x) spectral replication functionality of a DAC, using a post-DAC, band pass filter to isolate a baseband replica that falls within that sidelobe of the DAC's sinc(x) frequency response containing the desired IF. The parameters of a pre-compensation filter and the gain of a post DAC amplifier are set to compensate for the distortion and attenuation imparted by the DAC's sinc(x) frequency response.

19 Claims, 6 Drawing Sheets

1/f's (fs=40MSPS)

10MSPS

UP-CONVERSION MECHANISM EMPLOYING SIDE LOBE-SELECTIVE PRE-DISTORTION FILTER AND FREQUENCY REPLICA-SELECTING BANDPASS FILTER RESPECTIVELY INSTALLED UPSTREAM AND DOWNSTREAM OF DIGITAL-TO-ANALOG CONVERTER

FIELD OF THE INVENTION

The present invention relates in general to communication systems, and is particularly directed to the use of a digital-to-analog converter (DAC) and associated pre-compensation and post-conversion filter circuitry to directly up-convert a digitally sampled baseband signal into an intermediate frequency (IF) analog output signal, without the need for further IF analog up-conversion circuitry downstream of the DAC.

BACKGROUND OF THE INVENTION

Current implementations of (IF) up-conversion circuitry used in communication equipment for digitally formatted baseband signals customarily employ multiple frequency conversion (local oscillator/mixer) stages, in order to realize a desired IF analog output signal, to be supplied to the RF transmitter. The front end of such IF up-conversion circuitry, to which the digital baseband signals are applied, is typically configured as shown in FIG. 1 to include an up-conversion section 10, the output of which is filtered in a pre-compensation filter 20 at the input to a digital-to-analog converter (DAC) 30.

The initial up-conversion section 10 includes a quadrature interpolation filter 11 to which respective in-phase (I) and quadrature phase (Q) components of the digitally sampled baseband signal are applied. To conform with Nyquist-based standards, the sampling frequency fs of the interpolation filter 11 is greater than twice (e.g., on the order of two and one-half times) the highest frequency of the up-converted frequency of interest. The respective I and Q components of the interpolated baseband signal are then multiplied in respective mixers 12 and 13 by an IF local oscillator signal 14, and the resulting up-converted I and Q components are then summed in summing unit 15. The output of summing unit 15 is a real signal S, respective time and frequency domain representations of the signal S are shown in FIGS. 2 and 3, which is applied to the pre-compensation filter 20.

The pre-compensation filter 20 is operative to compensate for roll off in the main lobe of a (sinc(x)) frequency domain distortion function, diagrammatically illustrated in FIG. 4, to which the frequency content of the signal S is subjected by the DAC 30. (FIG. 5 shows the time domain representation of the ideal impulse response of the DAC 30.) Since a sinc(x) function has very shallow roll-off at frequencies below fs/2 (the interpolated Nyquist frequency), the roll-off in the main lobe is normally very minor. As it is converted into analog format by the DAC 30, the sampled time response of the signal S shown in FIG. 2 is convolved with the DAC's time domain response of FIG. 5, so that the output of the DAC 30 has a resultant time domain characteristic shown in FIG. 6.

As diagrammatically illustrated in FIG. 7, which is the frequency domain representation of the convolved DAC output of FIG. 6, the output of the DAC 30 effectively contains an infinite number of sidelobe-resident 'replicas' or 'images' of the frequency content of the sampled baseband signal shown in FIG. 2. These spectral replicas or images are mirrored or folded symmetrically above and below respective (center) frequencies that are integral multiples of fs/2 and multiplied by the sinc(x) frequency domain response function of the DAC, shown in FIG. 4.

This resultant output of the DAC 30 is lowpass filtered by a (smoothing) lowpass filter 40, to produce an analog baseband signal, shown in FIG. 8. Since, as noted above, the pre-compensation filter 20 is operative to compensate for roll-off in the main lobe of the (sinc(x)) frequency domain distortion function of FIG. 4, the combination of the pre-compensation filter 20 prior to the DAC 30 with the low pass filter 40 at the output of DAC is effective to remove all of the unwanted spectral replicas of the baseband beyond the fundamental or main lobe frequency response of the lowpass filtered analog signal, as shown in FIG. 9.

Now although the original baseband digital signal is now in analog format, this analog signal is still not at the intended IF frequency. As a consequence, it is necessary to perform up-conversion of the converted analog baseband signal to the IF frequency of interest by means of a further analog IF unit 50, to which the output of the DAC 30 is coupled via an amplifier 45. Similar to up-converter section 10, analog IF unit 50 includes a local oscillator 51, the output of which is multiplied in a mixer 52 by the analog baseband signal output by lowpass filter 40, and coupled to an IF bandpass filter 55 from which the IF output signal is derived. Undesirably, each of these additional components adds to the amount of hardware required for up-conversion and therefore increases the cost of the up-converter.

SUMMARY OF THE INVENTION

In accordance with the present invention, rather than remove the entirety of the spectral replica content in the output of the DAC that lies beyond the fundamental or baseband component of the DAC's frequency response, as in the prior art up-conversion scheme of FIG. 1, described above, advantage is taken of such spectral replication functionality of the DAC to extract a desired IF-centered replica that falls within a prescribed passband portion of the DAC's frequency response.

More particularly, as in the conventional IF up-conversion circuit of FIG. 1, the front end of the up-converter of the present invention also includes a quadrature interpolation filter to which respective in-phase and quadrature phase components of the digitally sampled baseband signal are applied. The respective I and Q components of the interpolated baseband signal are up-converted via mixers and an IF local oscillator and then summed to produce a real signal S.

The real signal S is coupled to a DAC through a pre-compensation filter. Unlike the pre-compensation filter in the conventional up-converter apparatus of FIG. 1, having a transfer function that compensates for roll off in the first or main lobe of the (sinc(x)) frequency domain distortion function of the DAC, the transfer function of pre-compensation filter used in the invention is tailored to compensate for roll off in that sidelobe of the (sinc(x)) frequency domain distortion function which contains the desired IF frequency $f_{IF}$. In accordance with a first embodiment of the invention, the pre-compensation filter is located between the output of the up-converter and the input to the DAC.

An additional difference between the apparatus of the present invention and the conventional up-converter of FIG. 1 is the fact that the resultant output of the DAC is bandpass-filtered by an 'image-selecting' bandpass filter, rather than lowpass filtered. The pass band of the bandpass filter falls between a lower integral multiple of one-half the sampling frequency (nfs/2), and an immediately adjacent upper integral multiple of one-half the sampling frequency ((n+1)fs/2), so that the bandpass filter isolates a respective replica of the frequency content of the signal at the desired IF frequency $f_{IF}$.

The output of the bandpass filter is coupled to an amplifier which amplifies the bandpass-filtered analog output signal, so as to compensate for attenuation of signal by the bandpass filter-selected sidelobe of the frequency domain representation of the convolved DAC output. Since the output of the amplifier is the original baseband signal up-converted to the desired intermediate frequency $f_{IF}$, the need to perform further up-conversion of the analog baseband signal to the desired IF frequency, for example, as by way of the analog IF unit 50 of the conventional up-converter of FIG. 1 is obviated, thereby reducing the hardware and cost of the up-converter.

In a second embodiment of the pre-compensation filter is inserted in the signal processing path upstream of the interpolation operation, which allows the filter to run at a lower computational rate. If the quadrature (I/Q) input signal is DC-centered, the pre-compensation filter is a complex filter, since its pre-compensation characteristic is asymmetric about DC.

In a third embodiment of the invention, the pre-compensation filter in the second embodiment is augmented by an interpolation-by-two filter, an Fs/4 up-converter stage upstream of the pre-compensation filter, and an Fs/4 down-converter stage downstream of the pre-compensation filter.

A fourth embodiment of the invention is configured to process a real (non-complex) input signal, in which a non-complex pre-compensation filter is inserted into the signal processing path upstream of an interpolation operation carried out by an interpolation filter of the up-conversion section. As in the second embodiment, inserting the pre-compensation filter prior to the interpolation operation allows the pre-compensation filter to run at a reduced computational rate.

In a fifth embodiment of the invention, a sample rate expanding stage is inserted between the output of the up-conversion section and the DAC. This sample rate insertion stage serves to to mitigate the sinc(x) roll-off effects in the DAC, by performing an L-fold multiplication of the number of spectral replicas in each sinc(x) lobe, where L is the expansion factor. As a result, the amplitude distortion across each replica near the center of each sinc(x) lobe is not so severely attenuated.

DETAILED DESCRIPTION

Figure 1:
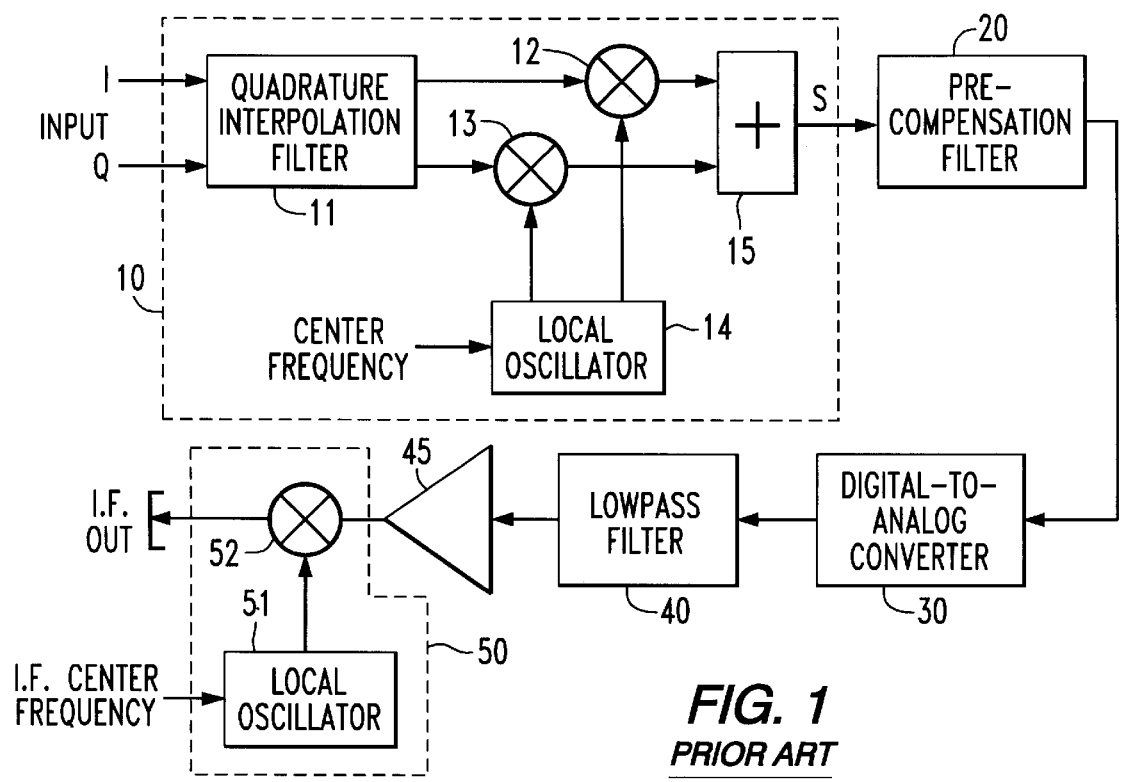
FIG. 1 diagrammatically illustrates a conventional implementation of (IF) up-conversion circuitry used in communication equipment for digitally formatted signals.

Before describing in detail the new and improved (IF) up-conversion signal processing apparatus in accordance with the present invention, it should be observed that the invention resides primarily in what is effectively a prescribed arrangement of conventional digital and analog communication circuits and associated signal processing components. Consequently, the configuration of such circuits and components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to show the major components of the up-conversion apparatus in a convenient functional grouping, whereby the present invention may be more readily understood.

As pointed out briefly above, rather than remove the entirety of the spectral replica content in the output of the DAC that lies beyond the baseband component of the DAC's frequency response, the up-conversion scheme of the present invention retains this spectral replication functionality, and selectively extracts a desired IF-centered replica that falls within a prescribed pass-band portion of the DAC's frequency response (corresponding to the bandwidth of the baseband signal).

Figure 2:
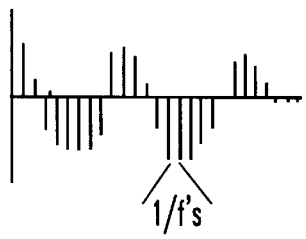
FIGS. 2 and 3 show respective time and frequency domain representations of a digitally sampled baseband signal.
Figure 3:
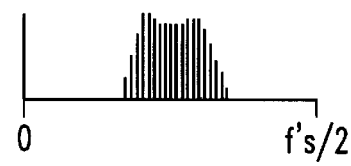
Figure 4:
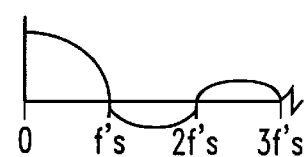
FIG. 4 diagrammatically illustrates a (sinc(x)) frequency domain distortion function produced by a digital-to-analog converter.
Figure 5:
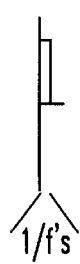
FIG. 5 shows the time domain representation of the ideal impulse response of a digital-to-analog converter.
Figure 6:
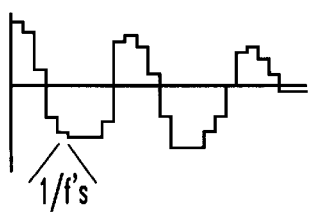
FIG. 6 shows the resultant time domain characteristic produced by convolving the sampled time response of FIG. 2 with the time domain representation of the ideal impulse response of a digital-to-analog converter of FIG. 5.
Figure 10:
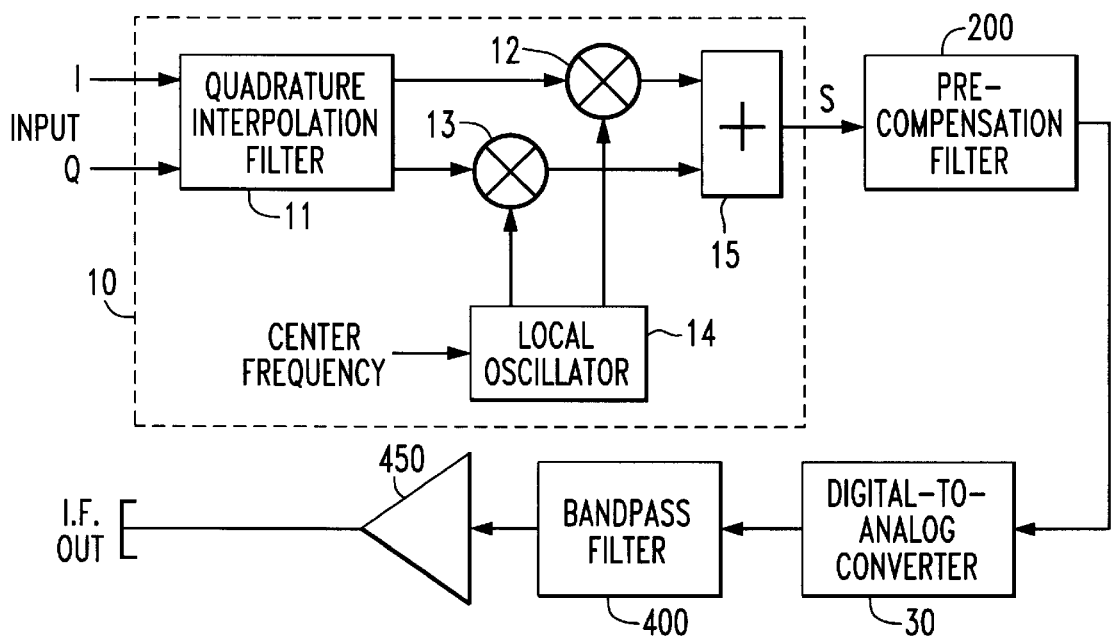
FIG. 10 diagrammatically illustrates the configuration of an (IF) up-converter in accordance with the present invention.

More particularly, as diagrammatically illustrated in FIG. 10, as in the conventional IF up-conversion circuit of FIG. 1, the front end of the up-converter of the present invention includes a quadrature interpolation filter 11 to which respective in-phase (I) and quadrature phase (Q) components of the digitally sampled baseband signal are applied. (As in the up-converter of FIG. 1, the sampling frequency fs of the interpolation filter 11 is at least twice the highest frequency of the up-converted frequency of interest.) The respective I and Q components of the interpolated baseband signal are multiplied in respective mixers 12 and 13 by an IF local oscillator signal 14, and the resulting up-converted I and Q components are then summed in summing unit 15, to produce a real signal S, whose time and frequency domain representations of the signal S are as shown in FIGS. 2 and 3, respectively, as described above. As a non-limiting example, the up-converter components of the front end up-converter may comprise an HSP 45116 NCOM modulator chip manufactured by Harris Corp.

The real signal S is coupled to DAC 30 through a pre-compensation filter 200. DAC 30 may comprise an HI 3050 digital-to-analog converter, manufactured by Harris Corp., and pre-compensation filter 200 may comprise a finite impulse response (FIR) filter, such as an HSP 43168 FIR filter, also manufactured by Harris Corp., as non-limiting examples. Unlike the pre-compensation filter 20 in the conventional up-converter apparatus of FIG. 1 (whose transfer function compensates for roll off in the first or main lobe of the (sinc(x)) frequency domain distortion function of the DAC), the transfer function of pre-compensation filter 200 is tailored or 'tuned' to compensate for roll off in a selected sidelobe of the (sinc(x)) frequency domain distortion function of the DAC, other than the main lobe. In particular, the transfer function of pre-compensation filter 200 is tailored to compensate for roll off in that sidelobe of the (sinc(x)) frequency domain distortion function which contains the desired IF frequency $f_{IF}$ and any other DAC transfer function distortion.

Figure 7:
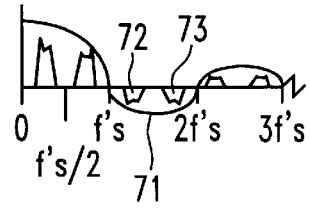
FIG. 7 shows the frequency domain characteristic associated with the time domain response of FIG. 6.
Figure 8:
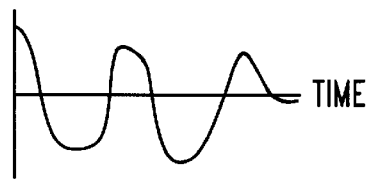
FIG. 8 shows an analog baseband signal produced by low pass filtering the output of the DAC 30 of the conventional implementation of (IF) up-conversion circuitry of FIG. 1.
Figure 9:
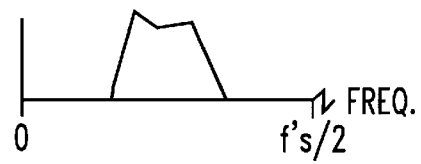
FIG. 9 shows the frequency domain characteristic of the lowpass filtered analog baseband signal of FIG. 8.

For purposes of providing a non-limiting example, as shown in FIG. 7, such a sidelobe may correspond to the first sidelobe 71 of the frequency domain representation of the convolved DAC output. Sidelobe 71 contains a pair of replicas 72 and 73 of the frequency content of the sampled baseband signal of FIG. 2, that are folded symmetrically above and below a respective integral multiple of one-half the sampling frequency fs. By configuring the parameters of pre-compensation filter 200 to compensate for the roll off behavior of this sidelobe, then that portion of the (sinc(x)) frequency domain distortion output function and any other distortion imparted to the interpolated baseband signal by the DAC 30 will not distort the desired baseband replica 72 or 73 contained in that sidelobe. (The characteristics of pre-compensation filter 200 may be tuned for a given portion of the sidelobe 71 containing the replica of interest (72 or 73), or for the entirety of the sidelobe, exclusive of the endpoints.)

Figure 11:
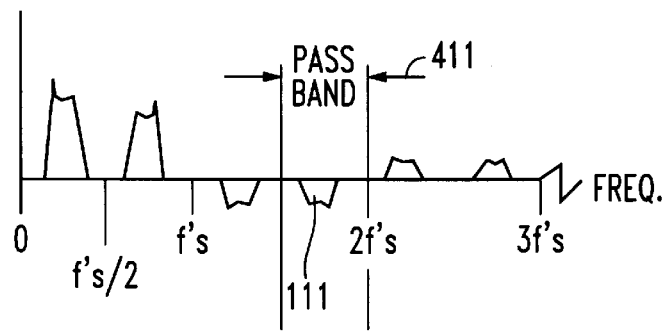
FIG. 11 shows the spectral output of the band pass filter 400 of the up-converter of FIG. 10, which falls between a lower frequency of 60 MHz at a first integral multiple (nfs/2) of one-half the sampling frequency of 40 MSPS, and an immediately adjacent upper integral multiple ((n+1)fs/2) of one-half the sampling frequency of 80 MHz.

An additional difference between the apparatus of the present invention shown in FIG. 10 and the conventional up-converter of FIG. 1 is the fact that the resultant output of the DAC 30 is bandpass-filtered by a (sidelobe-selecting) bandpass filter 400, rather than lowpass filtered. Bandpass filter may comprise a P-series bandpass filter manufactured by Trilithic Corp. As shown in FIG. 11, the pass band 411 of filter 400 should at least cover a frequency range of the bands of interest between a lower integral multiple of one-half the sampling frequency (nfs/2), and an immediately adjacent upper integral multiple of one-half the sampling frequency ((n+1)fs/2), so as to isolate a respective replica 111 of the frequency content of the signal at the desired IF frequency $f_{IF}$.

Figure 12:
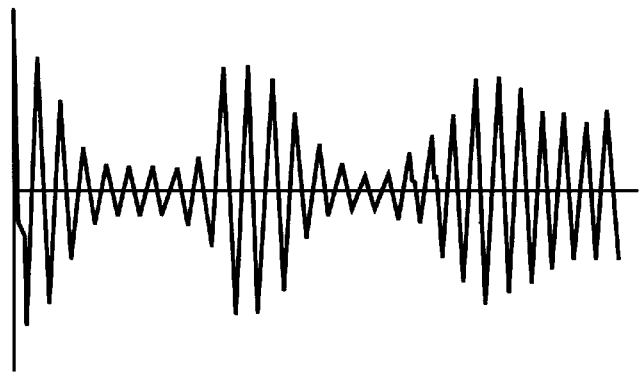
FIG. 12 shows the time domain associated with the bandpass filter spectral output of FIG. 11.

The output of bandpass filter 400 is coupled to an amplifier 450 which amplifies the bandpass-filtered analog output signal, whose time domain content is shown in FIG. 12, so as to compensate for attenuation of signal by the bandpass filter-selected sidelobe 71 of the frequency domain representation of the convolved DAC output of FIG. 7. Since the output of amplifier 450 is the original baseband signal up-converted to the desired intermediate frequency $F_{IF}$, the need to perform further up-conversion of the analog baseband signal to the desired IF frequency, for example, as by way of the analog IF unit 50 of the conventional up-converter of FIG. 1 is obviated, thereby reducing the hardware and cost of the up-converter.

Figure 13:
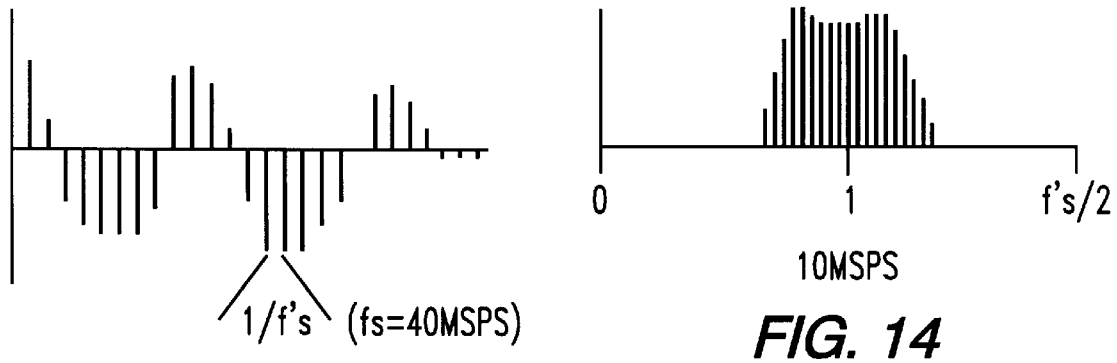
FIGS. 13 and 14 respectively show time and frequency domain representations of the digitally sampled baseband signal produced by the summing unit 15 of FIG. 10.
Figure 14:
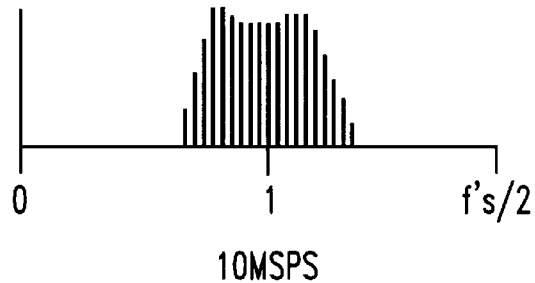

For purposes of providing a non-limiting illustration of the operation of the up-converter of FIG. 10, described above, let it be assumed that it is desired to up-convert a 7 MHz wide baseband signal, originally sampled at 10 megasamples per second (MSPS) to an IF center frequency of 70 MHz. For a DAC having a sampling rate of 40 MSPS, an interpolation factor of four is used to increase the original 10 MSPS sampling frequency of the I and Q components of the interpolated baseband signal. For the parameters of the present example, DAC 30 must also have an output bandwidth that is wide enough to prevent severe attenuation of the converted signal at frequencies up to approximately 75 MHz. The above-referenced HI 3050 model DAC will provide this desired performance. It will also be assumed that the initial up-conversion operation performed by I and Q mixers 12 and 13 and IF local oscillator signal 14 produces a center frequency of 10 MHz. The resulting up-converted I and Q components (centered at 10 MHz) are added together in summing unit 15, to produce a real signal S, whose time and frequency domain representations of the signal S are respectively shown in FIGS. 13 and 14.

Figure 15:
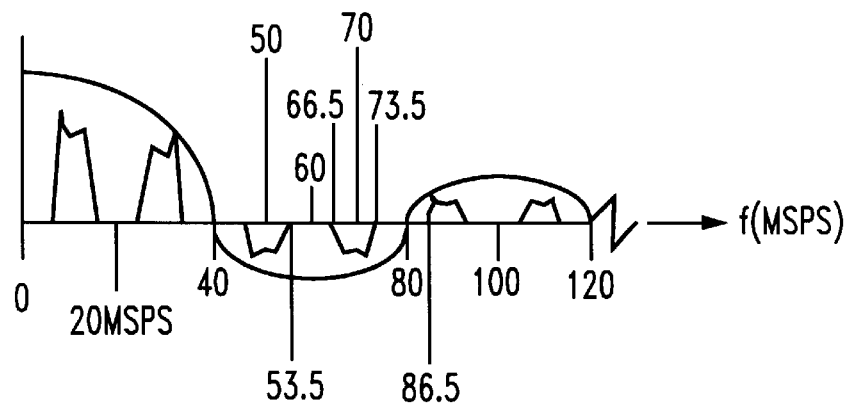
FIG. 15 shows the sinc(x) spectrum of a resultant signal produced by DAC 30 in FIG. 10, each lobe of which contains pairs of replicas of the (7 MHz wide) baseband signal centered at respective frequencies 10 MHz, 30 MHz, 50 MHz, 70 MHz, 90 MHz, 110 MHz, etc.

When this 10 MHz signal S is coupled through pre-compensation filter 200 and converted into analog format by DAC 30, what results is a signal having a sinc(x) frequency spectrum characteristic as shown in FIG. 15. Typically, the roll-off compensation of pre-compensation filter 200 will cover at least that portion of the sidelobe between adjacent integral multiples of one-half the sampling frequency and containing the IF frequency and signal bandwidth of interest.

As noted above, the parameters of the pre-compensation filter 200 are designed to compensate for the roll off behavior of at least that portion of the first sidelobe of the DAC's (sinc(x)) distortion function containing the baseband replica 73 that is centered about the desired center frequency of 70 MHz, namely covering a compensation bandwidth of at least from 66.5 Mhz and 73.5 MHz.

For the replica 73 of the signal S at the desired IF center frequency and signal bandwidth of the present example, the pass band of filter 400 is set to have a flat response that at least covers 7 MHz wide band centered at 70 MHz, namely a substantially flat response between at least 66.5 MHz and 73.5 MHz, and steep attenuation outside this pass band, so as to suppress unwanted replicas of the baseband signal and the baseband signal itself within the sinc(x) output of the DAC. Namely, the bandpass filter 400 has a passband whose lower frequency limit is no less than the upper frequency boundary of an immediately lower replica of the frequency content of said baseband signal and whose upper frequency limit is no higher than the lower frequency boundary of an immediately higher replica of the frequency content of said baseband signal.

As shown in FIG. 15, the closest edges of adjacent replicas occur at 53.5 Mhz (for an immediately lower frequency replica 72 centered at 50 MHz) and 86.5 Mhz (for an immediately high frequency replica 74 centered at 90 MHz), respectively. Therefore, the passband of filter 400 should severely attenuate frequencies equal to or less than 53.5 MHz and equal to or greater than 86.5 MHz.

The resultant, isolated up-converted 7 MHz wide analog signal is then amplified by amplifier 450, the gain of which is established to compensate for attenuation of the original signal by the first sidelobe of the sinc (x) function of the convolved DAC output and other DAC distortion, as described above. Thus, the output of amplifier 450 is the original baseband signal up-converted to the desired intermediate frequency $f_{IF}$ of 70 MHz.

Figure 16:
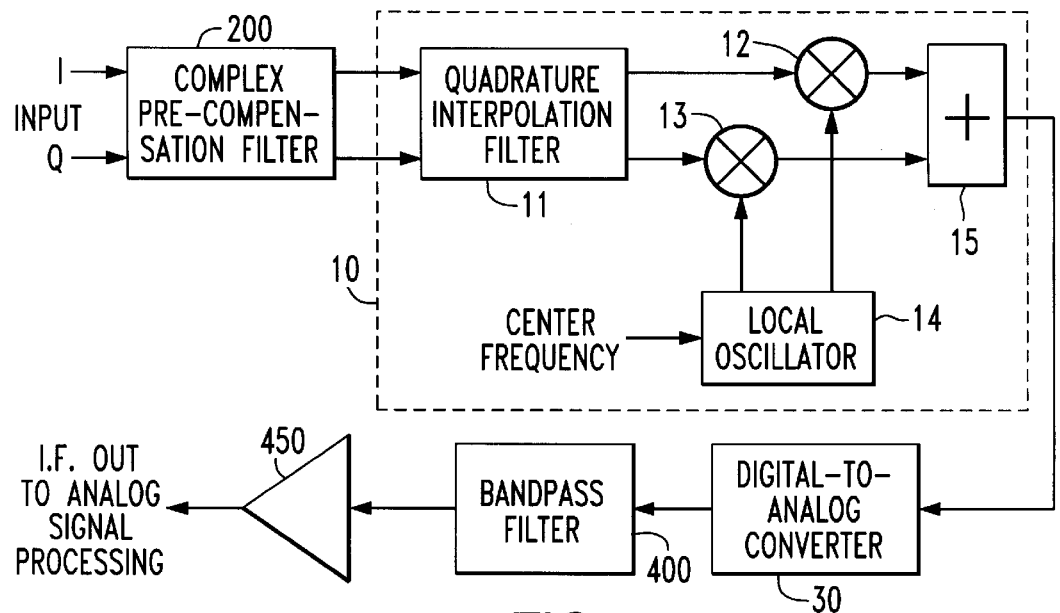
FIG. 16 shows a second embodiment of the invention, in which the pre-compensation filter is inserted into the signal processing path upstream of the interpolation operation.

FIG. 16 shows a second embodiment of the present invention, in which the pre-compensation filter 200 is inserted into the signal processing path upstream of the interpolation operation (carried out by quadrature interpolation filter 11). Locating pre-compensation filter 200 prior to the interpolation operation allows the pre-compensation filter 200 to run at a lower computational rate. If the quadrature (I/Q) input signal is DC-centered, the pre-compensation filter 200 must be a complex filter, since its pre-compensation characteristic is asymmetric about DC.

Figure 17:
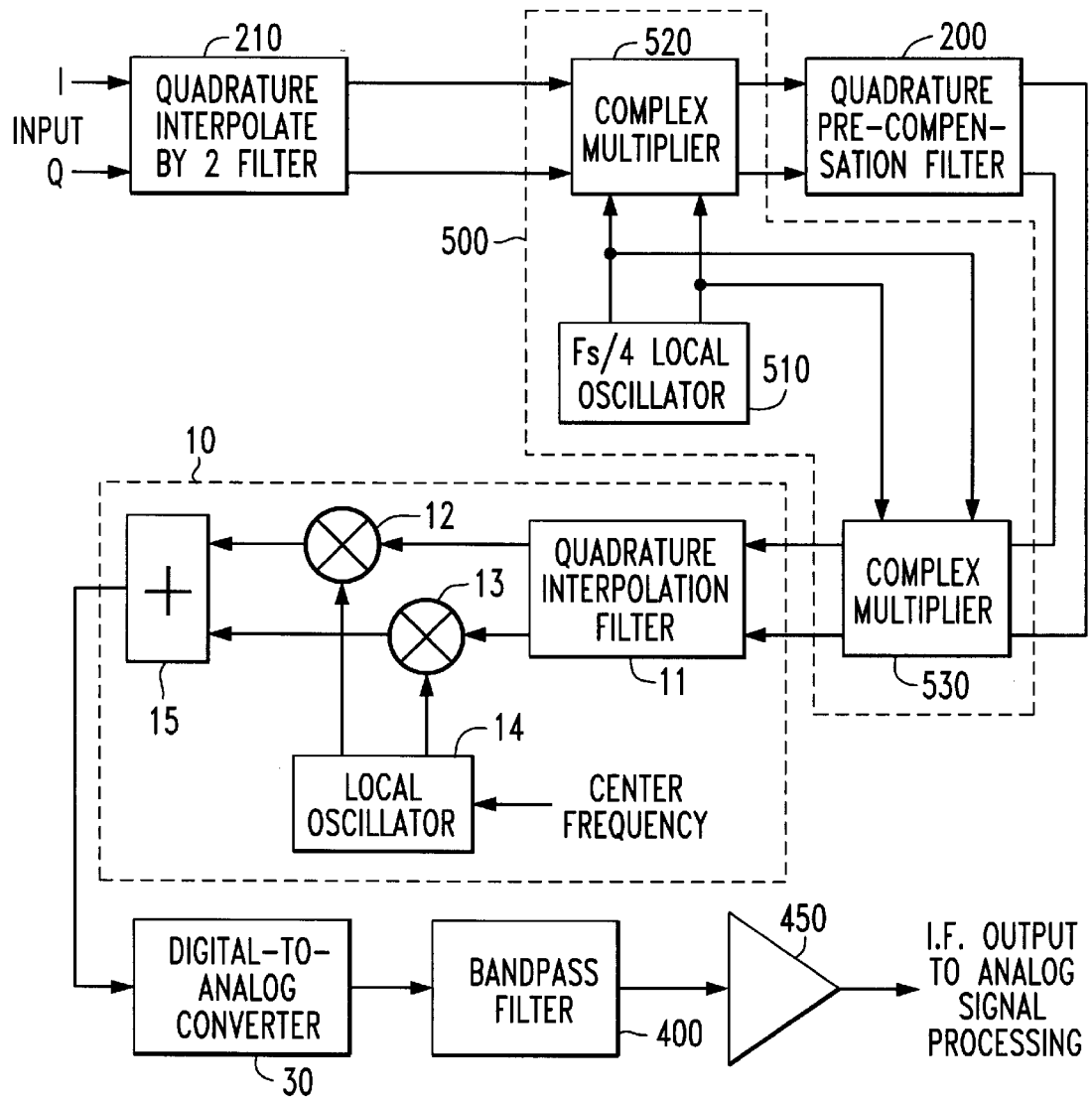
FIG. 17 shows a third embodiment of the invention, in which the pre-compensation filter of the embodiment of FIG. 16 is replaced by an interpolation-by-two filter, an Fs/4 up and down converter stage and a quadrature pre-compensation filter.
Figure 18:
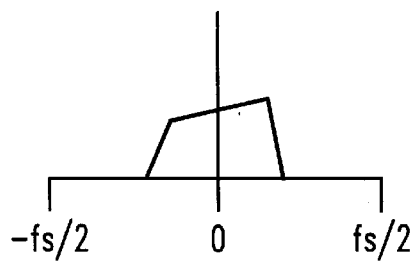
FIG. 18 shows the spectral characteristic of the output of the interpolate-by-two filter 210 of the embodiment of FIG. 17.
Figure 19:
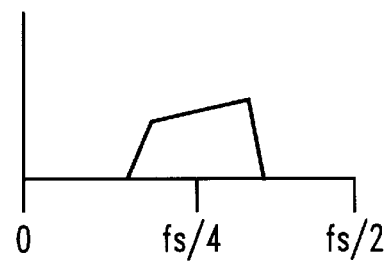
FIG. 19 shows the spectral characteristic of the output of center-frequency shifting complex multiplier 520 of the embodiment of FIG. 17.

FIG. 17 shows a third embodiment of the present invention, in which the pre-compensation filter 200 of the embodiment of FIG. 16 is augmented by an interpolate-by-two filter 210 and an Fs/4 up-converter and down-converter stage. The Fs/4 up-converter stage 500 includes an Fs/4 local oscillator 510 coupled to complex multipliers 520 and 530, disposed upstream and downstream, respectively, of pre-compensation filter 200. The spectral characteristic of the output of quadrature interpolate-by-two filter 210 is shown in FIG. 18, while the spectral characteristic of the output of center-frequency shifting complex multiplier 520 is shown in FIG. 19.

Figure 20:
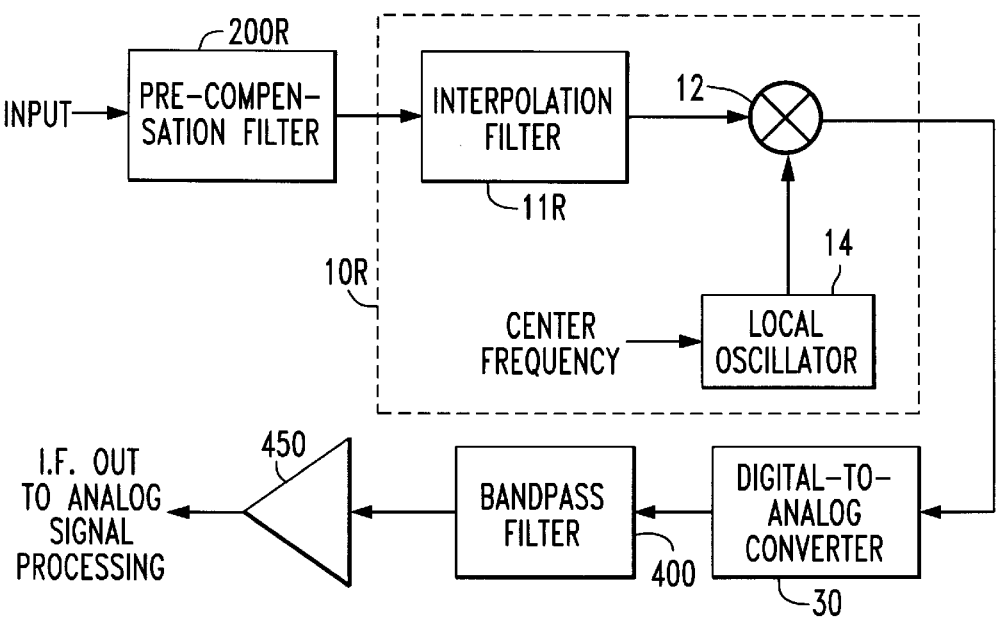
FIG. 20 shows a fourth embodiment of the invention for the case of a real (non-complex) input signal.

FIG. 20 shows a fourth embodiment of the present invention for the case of a real (non-complex) input signal, in which a non-complex pre-compensation filter 200R is inserted into the signal processing path upstream of an interpolation operation carried out by an interpolation filter 11R of up-conversion section 10R, containing local oscillator 14 and multiplier 12. As described above with reference to the embodiment of FIG. 16, locating pre-compensation filter 200R prior to the interpolation operation allows the pre-compensation filter to run at a lower computational rate.

Figure 21:
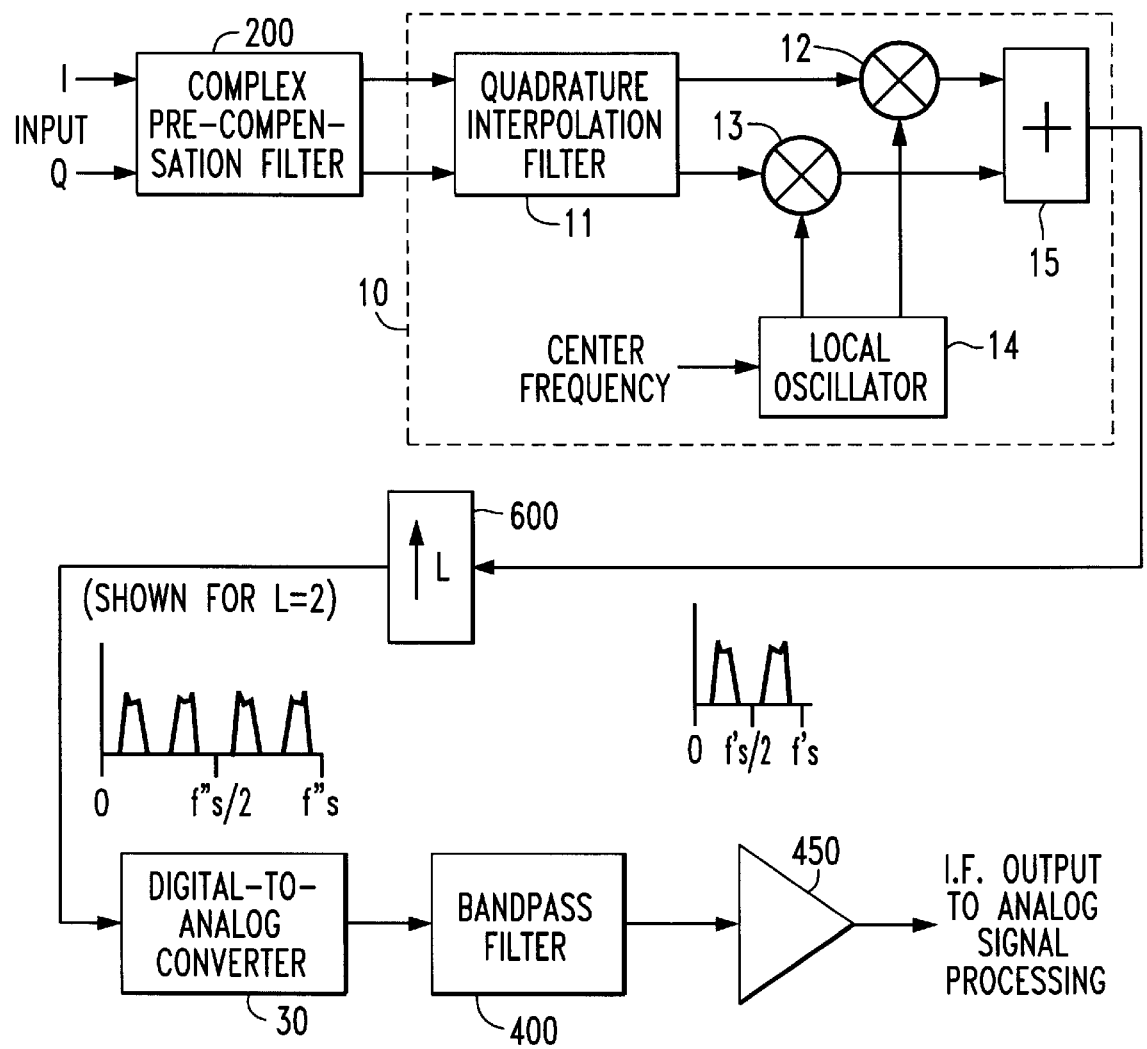
FIG. 21 shows a fifth embodiment of the invention, in which a sample rate expander is inserted between the output of up-conversion section and the DAC.
Figure 22:
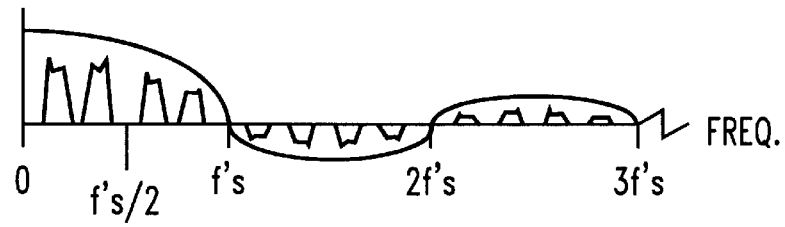
FIG. 22 diagrammatically illustrates the manner in which the sample rate expander of the embodiment of FIG. 21 performs an L-fold multiplication of the number of spectral replicas in each sinc(x) lobe.

FIG. 21 shows, as a fifth embodiment of the present invention, a modification of the second embodiment of FIG. 16, in which the pre-compensation filter 200 is inserted into the signal processing path upstream of the interpolation operation. In addition, a sample rate expander 600 is inserted between the output of up-conversion section 10 and DAC 30, which is operative to mitigate the sinc(x) roll-off effects in the DAC. In particular, as diagrammatically illustrated in FIG. 22, the sample rate expander 600 performs an L-fold multiplication of the number of spectral replicas in each sinc(x) lobe, where L (e.g., two as a non-limiting example) is the expansion factor. As a consequence, the amplitude distortion across each replica near the center of each sinc(x) lobe is not so severely attenuated.

As will be appreciated from the foregoing description, rather than use a low pass filter to remove the entirety of the spectral replica content in the output of the DAC that lies beyond the fundamental or baseband component of the DAC's sinc(x) frequency response, and then employ downstream analog up-converter components to achieve the desired IF frequency, as in the prior art up-conversion scheme of FIG. 1, the present invention takes advantage of the spectral replication functionality of the DAC, using a band pass filter to isolate a baseband replica that falls within that sidelobe of the DAC's sinc(x) frequency response containing the desired IF. The parameters of a pre-compensation filter and the gain of a post DAC amplifier are established to compensate for the distortion and attenuation imparted by the sinc(x) sidelobe and other distortion output by the DAC containing the desired IF.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of up-converting a baseband signal having a given bandwidth to an output signal having said given bandwidth centered at a prescribed center frequency higher than that of said baseband signal comprising the steps of:

(a) providing said baseband signal as a sampled input baseband signal;

(b) providing a digital-to-analog converter that is operative to convert a sampled signal supplied thereto into an analog signal having a spectral content containing distorted replicas of the frequency content of said sampled signal at successively adjacent spaced-apart center frequencies;

(c) modifying a prescribed frequency content of said sampled input baseband signal in accordance with a pre compensation mechanism that is operative to pre-distort said sampled baseband signal into a pre-distorted sampled baseband signal, such that processing of said pre-distorted sampled baseband signal by means of the digital-to-analog converter provided in step (b) produces an analog output signal having a spectral content of said sampled baseband signal at successively adjacent spaced-apart center frequencies, but with a selected normally distorted replica thereof other than in a main lobe of said baseband signal, and containing said given bandwidth centered at said prescribed center frequency higher than that of said baseband signal compensated by said pre-compensation mechanism;

(d) coupling said pre-distorted sampled baseband signal as modified in step (c) to said digital-to-analog converter, so as to produce said analog output signal in which said selected replica of the frequency content of said sampled baseband signal has been compensated by said pre-compensation mechanism; and (e) subjecting the analog output signal produced in step (d) to a bandpass filtering operation which produces a bandpass-filtered analog output signal having a frequency content that is limited to said selected replica of the frequency content of said baseband signal at said prescribed center frequency.

2. A method according to claim 1, wherein said digital-to-analog converter is operative to convert a sampled signal supplied thereto into an analog signal having a spectral content containing attenuated and distorted replicas of the frequency content of said sampled signal at said successively adjacent spaced-apart center frequencies, and wherein step (e) further comprises amplifying said bandpass-filtered analog output signal, so as to compensate for attenuation of said selected replica of the frequency content of said baseband signal at said prescribed center frequency.

3. A method according to claim 1, wherein step (a) comprises:

(a1) providing said baseband signal as a digitally sampled quadrature baseband signal, (a2) increasing the sampling frequency of said digitally sampled quadrature baseband signal into a prescribed multiple of the sampling frequency thereof, (a3) up-converting the center frequency of said digitally sampled quadrature baseband signal to a first center frequency spaced apart from the center frequency of the digitally sampled quadrature baseband signal provided in step (a), and (a4) summing the quadrature components of said digitally sampled quadrature baseband signal, having said first center frequency as up-converted in step (a3), to produce said sampled input baseband signal.

4. A method according to claim 3, wherein said digital-to-analog converter is operative to convert a sampled signal supplied thereto into an analog signal having a spectral content containing attenuated and distorted replicas of the frequency content of said sampled signal at said successively adjacent spaced-apart center frequencies, and wherein step (e) further comprises amplifying said bandpass-filtered analog output signal produced by said digital-to-analog converter in step (d), so as to compensate for attenuation of said selected replica of the frequency content of said baseband signal at said prescribed center frequency.

5. A signal processing apparatus for up-converting a digitally sampled baseband signal having a given bandwidth to an analog output signal having said given bandwidth centered at a prescribed center frequency higher than that of said digital baseband signal comprising:

an input signal port to which said digitally sampled baseband signal is applied;

a digital-to-analog converter that is operative to convert a sampled signal supplied thereto into an analog signal having a spectral content containing distorted replicas of the frequency content of said sampled signal at successively adjacent spaced-apart center frequencies;

a pre-compensation filter installed between said input signal port and said digital-to-analog converter and being operative to pre-distort said digitally sampled baseband signal into a pre-distorted digitally sampled baseband signal, such that processing of said pre-distorted digitally sampled baseband signal by said digital-to-analog converter produces an analog output signal having a spectral content of said digitally sampled baseband signal at successively adjacent spaced-apart center frequencies, but with a selected normally distorted replica thereof, other than in a main lobe of said baseband signal, and containing said given bandwidth centered at said prescribed center frequency higher than that of said baseband signal compensated by said pre-compensation mechanism; and a bandpass filter which is coupled to receive said analog output signal produced by said digital-to-analog converter and produces a bandpass-filtered analog output signal having a frequency content that is limited to that of said selected replica of the frequency content of said baseband signal at said prescribed center frequency.

6. A signal processing apparatus according to claim 5, wherein said digital-to-analog converter is operative to convert a digitally sampled signal supplied thereto into an analog signal having a spectral content containing attenuated and distorted replicas of the frequency content of said digitally sampled signal at said successively adjacent spaced-apart center frequencies, and further comprising an output amplifier which amplifies said bandpass-filtered analog output signal, so as to compensate for attenuation of said selected replica of the frequency content of said digitally sampled baseband signal at said prescribed center frequency.

7. A signal processing apparatus according to claim 5, wherein said digitally sampled baseband signal comprises a digitally sampled quadrature baseband signal, and further including a quadrature interpolation filter which is operative to increase the sampling frequency of said digitally sampled quadrature baseband signal into a prescribed multiple of the sampling frequency thereof, an up-converter which is operative to up-converting the center frequency of said digitally sampled quadrature baseband signal to a first center frequency spaced apart from the center frequency of the digitally sampled quadrature baseband signal, and a combining unit which is operative to sum the quadrature components of said digitally sampled quadrature baseband signal, to produce said digitally sampled input baseband signal that is applied to said input port.

8. A signal processing apparatus according to claim 7, wherein said digital-to-analog converter is operative to convert a digitally sampled signal supplied thereto into an analog signal having a spectral content containing attenuated and distorted replicas of the frequency content of said digitally sampled signal at said successively adjacent spaced-apart center frequencies, and further comprising an output amplifier which is operative to amplify said bandpass-filtered analog output signal so as to compensate for attenuation of said selected replica of the frequency content of said digitally sampled baseband signal at said prescribed center frequency.

9. An up-converter for a sampled baseband signal, said up-converter comprising a digital-to-analog converter having a frequency domain distortion function, a pre-compensation filter, having an input to which said sampled baseband signal is coupled, and an output coupled to said digital-to-analog converter, said pre-compensation filter having a transfer function that compensates for distortion of a selected portion of said frequency of said frequency domain distortion function containing a desired IF frequency, other than a main lobe of said baseband signal, and a bandpass filter to which the analog output of said digital-to-analog converter is coupled, said bandpass filter having a passband that isolates a selected replica of the frequency content of said baseband signal at said desired IF frequency.

10. An up-converter according to claim 9, further comprising an amplifier to which the output of said bandpass filter is coupled, and which is operative to amplify the output of said bandpass filter, so as to compensate for attenuation of signal by said frequency domain distortion function of said digital-to-analog converter.

11. An up-converter according to claim 9, wherein said frequency domain distortion function comprises a sinc(x) function having respective sidelobes containing replicas of said baseband signal, and wherein said bandpass filter has a passband that covers at least the bandwidth of said baseband signal centered at said desired IF frequency.

12. An up-converter according to claim 11, wherein said bandpass filter has a passband having a lower frequency limit no less than the upper frequency boundary of an immediately lower replica of the frequency content of said baseband signal and an upper frequency limit no higher than the lower frequency boundary of an immediately higher replica of the frequency content of said baseband signal.

13. An up-converter according to claim 7, wherein said pre-compensation filter is upstream of said quadrature interpolation filter.

14. An up-converter according to claim 13, wherein said pre-compensation filter is a complex filter having a pre-compensation characteristic asymmetric about DC.

15. An up-converter according to claim 5, further including an interpolation-by-two filter and an up-converter stage upstream of said pre-compensation filter, and a down-converter stage downstream of said downstream of the pre-compensation filter.

16. An up-converter according to claim 5, further including a sample rate expander disposed upstream of said digital-to-analog converter and being operative to mitigate sinc(x) roll-off effects in said digital-to-analog converter.

17. A signal processing apparatus according to claim 5, wherein said digitally sampled baseband signal comprises a digitally sampled baseband signal, and further including an interpolation filter which is operative to increase the sampling frequency of said digitally sampled baseband signal into a prescribed multiple of the sampling frequency thereof, and an up-converter stage which is operative to up-converting the center frequency of said digitally sampled baseband signal to a first center frequency spaced apart from the center frequency of the digitally sampled baseband signal.

18. An up-converter according to claim 17, wherein said pre-compensation filter is upstream of said quadrature interpolation filter.

19. An up-converter according to claim 18, wherein said pre-compensation filter is a non-complex filter.

* * * * *